United States Patent
Lee et al.

(10) Patent No.: US 9,525,384 B2
(45) Date of Patent: Dec. 20, 2016

(54) METHOD AND APPARATUS FOR SUPPLYING POWER TO A RADIO FREQUENCY POWER AMPLIFIER

(71) Applicant: Samsung Electronics Co., Ltd., Gyeonggi-do (KR)

(72) Inventors: Sung-Jun Lee, Gyeonggi-do (KR); Ji-Seon Paek, Gyeonggi-do (KR); Seung-Chul Lee, Gyeonggi-do (KR); Yong-Sik Youn, Cupertino, CA (US); Jun-Hee Jung, Gyeonggi-do (KR); Thomas Byunghak Cho, Gyeonggi-do (KR); Sang-Wook Han, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/843,512

(22) Filed: Sep. 2, 2015

(65) Prior Publication Data
US 2016/0065139 A1    Mar. 3, 2016

Related U.S. Application Data

(60) Provisional application No. 62/044,725, filed on Sep. 2, 2014.

(30) Foreign Application Priority Data

Apr. 30, 2015  (KR) ........................ 10-2015-0061379

(51) Int. Cl.
*H01Q 11/12*   (2006.01)
*H04B 1/04*    (2006.01)
(Continued)

(52) U.S. Cl.
CPC .......... *H03F 1/0227* (2013.01); *H03F 1/0222* (2013.01); *H03F 3/19* (2013.01);
(Continued)

(58) Field of Classification Search
CPC ............... H04B 2001/0408; H04B 2001/0416; H03F 3/20; H03F 1/0227
See application file for complete search history.

(56) References Cited

U.S. PATENT DOCUMENTS 7,808,323 B2   10/2010   Takinami et al.
8,417,199 B2    4/2013   Murji
(Continued)

FOREIGN PATENT DOCUMENTS

WO    WO 2004/010283    1/2004

*Primary Examiner* — Nguyen Vo
(74) *Attorney, Agent, or Firm* — The Farrell Law Firm, P.C.

(57) ABSTRACT

A method and a supply modulator (SM) are provided for supplying power from a wireless transmitter to a radio frequency (RF) power amplifier. A power control signal input from a modem is received. A reference voltage is determined. An operating mode of the SM is changed by controlling a level of the reference voltage. A voltage is determined based on the level of a reference voltage. When the operating mode of the SM is an ET mode, a first output signal from a linear regulator and a second output signal from a switching regulator are combined to obtain a combined result, and the combined result is output. The first output signal is based on the voltage. When the operating mode of the SM is an APT mode, the voltage based on the reference voltage is output.

20 Claims, 9 Drawing Sheets

(51) Int. Cl.
  *H03F 1/02* (2006.01)
  *H03F 3/19* (2006.01)
  *H03G 3/30* (2006.01)
  *H03F 3/21* (2006.01)
  *H03F 3/24* (2006.01)
  *H03F 3/72* (2006.01)

(52) U.S. Cl.
  CPC ............ *H03F 3/211* (2013.01); *H03F 3/245* (2013.01); *H03F 3/72* (2013.01); *H03G 3/3042* (2013.01); *H04B 1/0475* (2013.01); *H03F 2200/102* (2013.01); *H03F 2200/375* (2013.01); *H03F 2200/411* (2013.01); *H03F 2200/432* (2013.01); *H03F 2200/451* (2013.01); *H03F 2200/78* (2013.01); *H03F 2203/7227* (2013.01); *H04B 2001/0441* (2013.01)

(56) References Cited

U.S. PATENT DOCUMENTS

| | | | |
|---|---|---|---|
| 8,457,246 B2 | 6/2013 | Kim et al. | |
| 2007/0211821 A1* | 9/2007 | Haque | H03F 3/217 375/297 |
| 2013/0285751 A1* | 10/2013 | Dhanasekaran | H03F 3/21 330/297 |
| 2014/0273897 A1* | 9/2014 | Drogi | H04B 1/0458 455/127.3 |
| 2015/0054588 A1* | 2/2015 | Wimpenny | H03F 1/0227 330/297 |

* cited by examiner

METHOD AND APPARATUS FOR SUPPLYING POWER TO A RADIO FREQUENCY POWER AMPLIFIER

PRIORITY

This application claims priority under 35 U.S.C. §119(e) to a U.S. provisional application filed on Sep. 2, 2014 in the U.S. Patent and Trademark Office and assigned Ser. No. 62/044,725, and under 35 U.S.C. §119(a) to a Korean patent application filed on Apr. 30, 2015 in the Korean Intellectual Property Office and assigned Serial No. 10-2015-0061379, the contents of which are incorporated herein by reference.

BACKGROUND

1. Field of the Disclosure

The present disclosure relates generally to a supply modulator (SM) used for radio transmitters in communication systems.

2. Description of Related Art

Battery power consumption is considered to be a very important aspect of applications for radio communication terminals. Thus, a highly efficient radio frequency (RF)/analog output amplifier is required for long battery use. With the evolution from 2G to 3G/4G, highly efficient characteristics are required with a high peak-to-average power ratio (PAPR). Furthermore, 4G communication channels demand terminals having hardware for high linearity and high bandwidth. The RF/analog output amplifier required in terminals for RF communication has procedural and circuit-structural limitations that make it difficult to satisfy all of the above-described requirements.

The efficiency of an RF power amplifier (RF PA) decreases as the PAPR of an input signal increases. Since high PAPR characteristics require a high 1 dB gain compression point (P1 dB) and saturated power of the RF PA, all existing RF PAs operating with limited fixed supplies, such as, for example, batteries, have low power efficiency in peak power and back-off power regions.

Therefore, to improve the low power efficiency in the back-off power region, an average power tracking (APT) technology has been developed to control a fixed supply voltage while tracking an average power. However, when the APT technology is applied, the fixed supply voltage is unable to instantaneously catch up with an envelope signal, and thus, the RF PA suffers additional power loss.

In an attempt to rectify the additional power loss, an envelope tracking (ET) technology has been developed. The ET technology increases the RF PA efficiency, improving the efficiency of the RF PA by instantaneously following an input envelope signal. Accordingly, to apply the ET technology to the RF PA, a supply modulator (SM) is required to normalize battery power for an envelope signal. The SM is required to have both a high bandwidth and a high efficiency, and thus, typically employs a hybrid structure in which a linear regulator including a linear amplifier and a switching regulator are combined.

Figure 1:
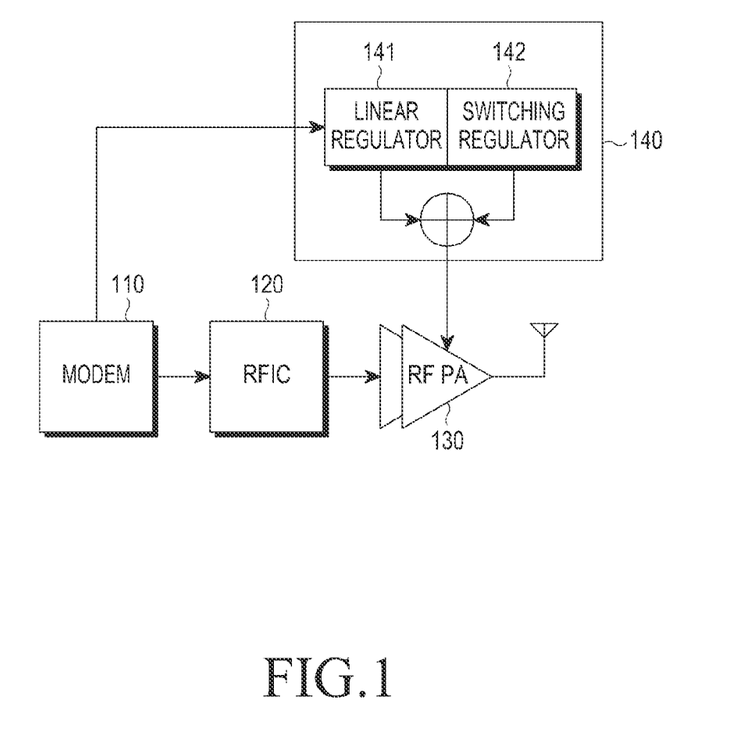
FIG. 1 is a block diagram illustrating a transmitting end including a conventional hybrid SM.

FIG. 1 is a block diagram illustrating a transmitter including a general hybrid SM.

Referring to FIG. 1, a modem 110 provides an RF integrated circuit (RFIC) 120 with a transmit signal containing information for transmission. The modem 110 also provides an SM 140 with an envelope signal generated by modulating the transmit signal.

The RFIC 120 outputs an RF signal by modulating the transmit signal into carrier waves of the system band, and an RF PA 130 amplifies the RF signal to a required power level and transmits the amplified RF signal through an antenna.

The SM 140 delivers battery power to the RF PA 130 in the procedure of amplifying and normalizing the envelope signal input from the modem 110. The SM 140 controls the fixed supply power provided from the battery based on the envelope signal, so that the SM 140 and the RF PA 130 may have optimum linearity and efficiency.

Furthermore, the SM 140 of FIG. 1 has a hybrid structure in which a switching regulator 142, and a linear regulator 141 including a linear amplifier are combined. Outputs of the linear regulator 141 and the switching regulator 142 are combined by a combiner, and the combined result is provided to the RF PA 130 as a supply voltage of the RF PA 130. The linear regulator 141 guarantees high output accuracy in the supply voltage of the RF PA 130 by tracking the high frequency region of the envelope signal. The switching regulator 142 tracks a low frequency region of the envelope signal to provide a wide range of output voltage.

The RF PA 130 tracks the saturated power and amplifies an output signal of the RFIC 120 with the power supplied from the SM 140. In this regard, the RF PA 130 operates in an average power tracking (APT) mode or an envelope tracking (ET) mode, depending on the output power. Specifically, if the output power is less than a predetermined value, the RF PA 130 operates in the APT mode and uses an output of a buck-boost converter within the SM 140 as the fixed power. On the contrary, if the output power is greater than or equal to the predetermined value, the RF PA 130 operates in the ET mode and uses an output of the SM 140 of the hybrid structure as the fixed power.

The efficiency of a power amplifier is determined by the product of an efficiency of the SM and an efficiency of the power amplifier itself. Since the efficiency of the SM decreases and the ET effect is reduced as the output power is backed off, the efficiency of the power amplifier in the APT mode becomes higher than the efficiency of the power amplifier in the ET mode below a certain value (back-off power). Accordingly, to widen the dynamic range of the ET mode, both the ET effect and the back-off power efficiency of the SM should be improved.

Furthermore, to maximize the efficiency of the power amplifier in the ET mode, the SM tracks a saturated voltage by controlling the supply voltage of the RF PA. In this regard, due to the tracking of the saturated voltage and a knee voltage effect, additional shaping of an output voltage of the SM is required. A shape table that is optimized for back-off power values is required to improve the back-off effect of the power amplifier in the ET mode by adaptively controlling the output voltage of the SM based on the back-off power. However, output voltage shaping by power control requires an increase in the complexity of the operation of the communication system and an RF driver.

Furthermore, the output voltage of the hybrid SM is scaled down in proportion to the back-off power. In other words, there is an efficiency loss of a linear amplifier in proportion to a ratio of output voltage to fixed supply voltage, which reduces the entire efficiency of the SM due to the back-off power. Since the maximum fixed supply voltage of the linear amplifier is determined by a peak output voltage, the fixed supply voltage of the linear amplifier, which is high in the back-off power region, affects the entire efficiency of the SM.

SUMMARY

Aspects of the present disclosure provide a structure and method for improving respective efficiencies of the peak power and the back-off power of a power amplifier operating in an ET mode, by using an SM to adaptively control an envelope shape table and a supply voltage of the SM in respective APT and ET modes to suit the desired level of output power. In accordance with an aspect of the present disclosure, an SM is provided for supplying power from a wireless transmitter to an RF power amplifier. The SM includes a power controller configured to receive a power control signal input from a modem and output a reference voltage. The power controller changes an operating mode of the SM by controlling a level of the reference voltage. The SM also includes a buck booster configured to receive the reference voltage from the power controller and output a voltage based on the level of a reference voltage. The SM additionally includes a combiner configured to combine a first output signal from a linear regulator and a second output signal from a switching regulator to obtain a combined result, and to output the combined result. The first output signal is based on the voltage from the buck booster. The SM further includes a switch having a first end connected to a power supply end of the RF power amplifier and a second end that is switchable between the buck booster and the combiner, and configured to change the operating mode of the SM to an ET mode or an APT mode based on whether the second end is connected to the buck booster or the combiner.

In accordance with another aspect of the present disclosure, a method is provided for supplying power from a wireless transmitter to a RF power amplifier by an SM. A power control signal input from a modem is received. A reference voltage is determined. An operating mode of the SM is changed by controlling a level of the reference voltage. A voltage is determined based on the level of a reference voltage. When the operating mode of the SM is an ET mode, a first output signal from a linear regulator and a second output signal from a switching regulator are combined to obtain a combined result, and the combined result is output. The first output signal is based on the voltage. When the operating mode of the SM is an APT mode, the voltage based on the reference voltage is output.

In accordance with another aspect of the present disclosure, an article of manufacture is provided for supplying power from a wireless transmitter to a RF power amplifier by a SM. The article of manufacture includes a non-transitory machine readable medium containing one or more programs which when executed implement the steps of: receiving a power control signal input from a modem; determining a reference voltage, wherein an operating mode of the SM is changed by controlling a level of the reference voltage; determining a voltage based on the level of a reference voltage; when the operating mode of the SM is an envelope tracking (ET) mode, combining a first output signal from a linear regulator and a second output signal from a switching regulator to obtain a combined result, and outputting the combined result, wherein the first output signal is based on the voltage; and when the operating mode of the SM is an average power tracking (APT) mode, outputting the voltage based on the reference voltage.

BRIEF DESCRIPTION OF THE DRAWINGS

The above and other aspects, features, and advantages of the present disclosure will be more apparent from the following detailed description when taken in conjunction with the accompanying drawings in which.

DETAILED DESCRIPTION

Embodiments are described in detail with reference to the accompanying drawings. The same or similar components may be designated by the same or similar reference numerals although they are illustrated in different drawings. Detailed descriptions of constructions or processes known in the art may be omitted to avoid obscuring the subject matter of the present invention.

The terms "include", "comprise", and their derivatives, as used herein, are defined as non-exclusive inclusion. The term "and/or", as used herein, includes any and all combinations of one or more of the associated listed items. The phrases "associated with", "associated therewith", and/or their derivatives, as used herein, are substantially equivalent to 'include', 'be included within', 'interconnect with', 'contain', 'be contained within', 'connect to or with', 'couple to or with', 'be communicable with', 'cooperate with', 'interleave', 'juxtapose', 'be proximate to', 'be bound to or with', 'have', 'have a property of', etc. The term "controller" refers to a device, a system, or a part of the device or the system that controls at least a piece of the operation, and may be implemented in hardware, firmware, software, and/or a combination thereof. It is noted that any functionality associated with a particular controller may be centralized or distributed, or locally or remote-controlled. It will be further understood that terms, such as those defined in commonly used dictionaries, should be interpreted as having meanings that are consistent with their meanings in the context of the relevant art, and will not be interpreted in an idealized or overly formal sense unless expressly so defined herein.

Terms, which are described in detail below, are defined by taking into account functionalities of embodiments of the present disclosure, but may vary depending on certain practices or intentions of users or operators. Accordingly, the definitions of such terms should be made based on the descriptions herein.

It is to be understood that the singular forms "a," "an," and "the" include plural references unless the context clearly dictates otherwise. Accordingly, for example, a "component surface" may include one or more component surfaces. It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosure.

A terminal, according to various embodiments of the present disclosure, may have a communication functionality. For example, the terminal may be embodied as a smart phone, a tablet personal computer (PC), a mobile phone, a video phone, an e-book reader, a desktop PC, a laptop PC, a netbook PC, a personal digital assistant (PDA), a portable multimedia player (PMP), an MP3 player, a mobile medical instrument, a camera, a wearable device (e.g., a head-mounted device (HMD)), an electronic cloth, an electronic bracelet, an electronic necklace, an electronic appcessory, an electronic tattoo, a smart watch, etc.

In accordance with various embodiments of the present disclosure, the terminal may also be embodied as a smart home appliance with the communication functionality. For example, the smart home appliance may be a television, a digital versatile disc (DVD) player, an audio player, a refrigerator, an air conditioner, a vacuum cleaner, an oven, a microwave oven, a washer, a dryer, an air purifier, a set-top box, a TV box, a gaming console, an electronic dictionary, a camcorder, an electronic photo frame, etc.

In accordance with various embodiments of the present disclosure, the terminal may be embodied as a medical device (e.g., a magnetic resonance angiography (MRA) device, a magnetic resonance imaging (MRI) device, a computed tomography (CT) device, an imaging device, or an ultrasonic device), a navigation system, a global positioning system (GPS) receiver, an event data recorder (EDR), a flight data recorder (FDR), an automotive infotainment device, a marine electronic device (e.g., a marine navigation system, a gyroscope, or a compass), an aviation electronic device, a security device, an industrial or consumer robot, etc.

The terminal, according to various embodiments of the present disclosure, may also be embodied as furniture, a part of a building/structure, an electronic board, an electronic signature receiver device, a projector, any of various measuring devices (e.g., a water meter, an electricity meter, a gas meter, or a meter for electromagnetic radiation), etc., each having communication functionality. According to various embodiments of the present invention, the terminal may be a combination of the aforementioned devices. However, the electronic device is not limited thereto.

A method and an apparatus, in accordance with an embodiment of the present disclosure, may be applied to various communication systems, e.g., Institute of Electrical and Electronics Engineers (IEEE) 802.11 ac communication systems, IEEE 802.16 communication systems, digital multimedia broadcasting (DMB) services, mobile broadcasting services such as digital video broadcasting-handheld (DVB-H) services and advanced television systems committee mobile/handheld (ATSC-M/H) services, digital video broadcasting systems, such as, for example, Internet protocol television (IPTV) systems, Moving Picture Experts Group (MPEG) media transport (MMT) systems, evolved packet systems (EPSs), long term evolution (LTE) mobile communication systems, LTE-advanced (LTE-A) mobile communication systems, high speed downlink packet access (HSDPA) mobile communication systems, $3^{rd}$ generation partnership project 2 (3GPP2) high rate packet data (HRPD) mobile communication systems, 3GPP2 wideband code divisional multiple access (WCDMA) mobile communication systems, 3GPP2 code divisional multiple access (CDMA) mobile communication systems, mobile IP systems, etc.

In an embodiment of the present disclosure, a method and an apparatus are provided, by which an SM adaptively operates in an ET mode or an APT mode depending on a fixed supply voltage and an output voltage, and accordingly, controls the output voltage in order to improve an efficiency of an RF power amplifier used in a transmitter of a terminal for radio communication. In another embodiment of the present disclosure, a method is provided for an SM to supply an optimal fixed supply voltage by taking into account changes in input signal characteristics, and changes in gain and offset of the SM for efficiently handling the changes in input signal characteristics.

Figure 2:
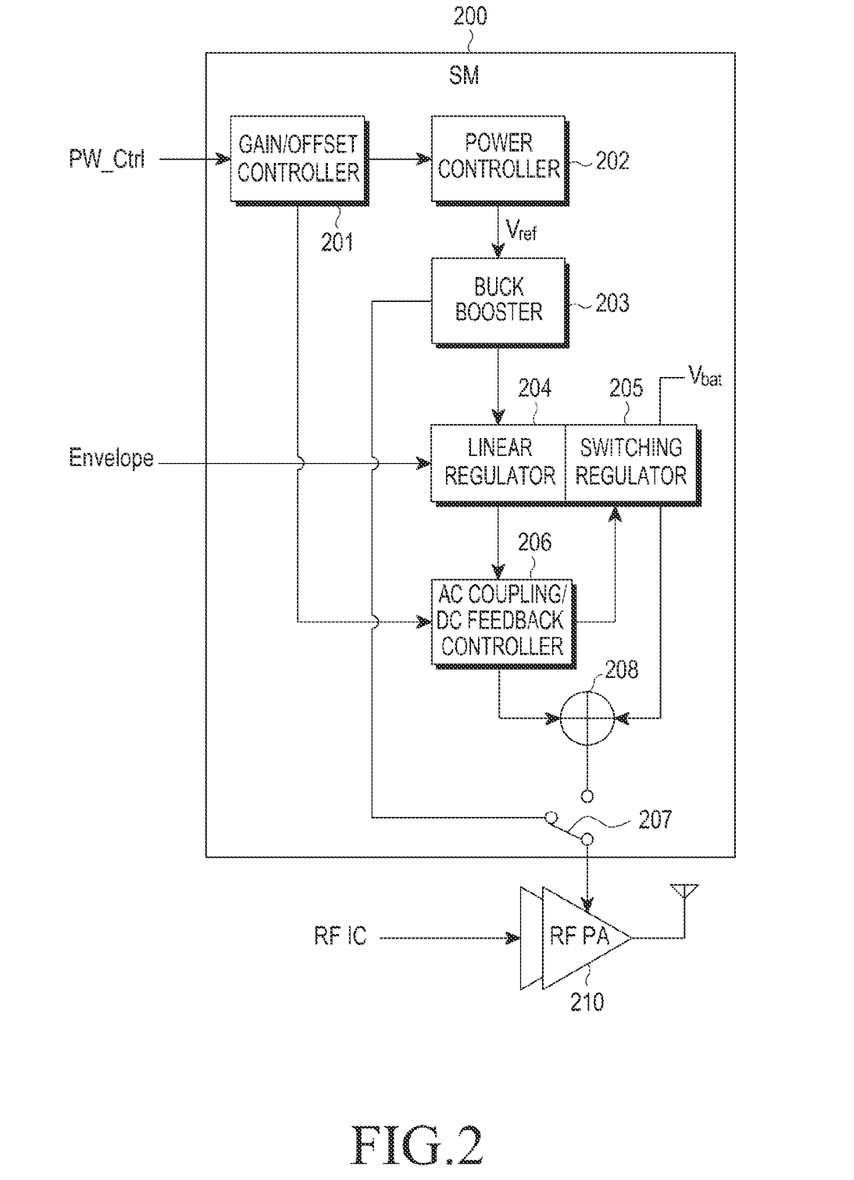
FIG. 2 is a block diagram illustrating an SM, according to an embodiment of the present disclosure.

FIG. 2 is a block diagram illustrating an SM, according to an embodiment of the present disclosure.

Referring to FIG. 2, an SM 200 includes a gain/offset controller 201, a power controller 202, a buck booster 203, a linear regulator 204, a switching regulator 205, an AC coupling/DC feedback controller 206, and a switch 207 for changing the mode of the SM 200 from ET to APT for efficiency improvement at small signal levels.

The gain/offset controller 201 serves to improve back-off power efficiency in the ET mode, and controls a gain and an offset of an output voltage of the SM 200 based on output power of an RF PA 210 operating in the ET mode by receiving a power control signal PW_Ctrl from a modem and sending a reference signal to the AC coupling/DC feedback controller 206.

The power controller 202 determines the ET mode or the APT mode of the RF PA 210 depending on the level of the power control signal PW_Ctrl input from the modem, and adaptively controls output voltage of the buck booster 203 by controlling reference voltage Vref input to the buck booster 203.

The buck booster 203 controls the output voltage based on the level of the reference voltage Vref input from the power controller 202, and provides the fixed supply voltage to the linear regulator 204 in the ET mode, while providing the output voltage straight to the RF PA 210 via the switch 207 in the APT mode. Contact of the switch 207 is controlled by an external control signal.

The linear regulator 204 receives a fixed supply voltage from the buck booster 203, amplifies an envelope signal input from the modem, and sends the amplified envelope signal to the AC coupling/DC feedback controller 206.

The AC coupling/DC feedback controller 206 combines an AC-coupled signal from the signal output from the linear regulator 204, and a signal output from the switching regulator 205 at a combiner 208, and provides the combined result to the RF PA 210 as the fixed supply voltage. Furthermore, the AC coupling/DC feedback controller 206 outputs a signal to control the switching regulator 205 by detecting a DC signal from the output signal from the linear regulator 204.

A digital to analog converter (DAC) is required between the output of a digital circuit and the input of an analog circuit, and the DAC may be located in the digital circuit or connected to the output end of the digital circuit as a separate circuit.

Figure 3:
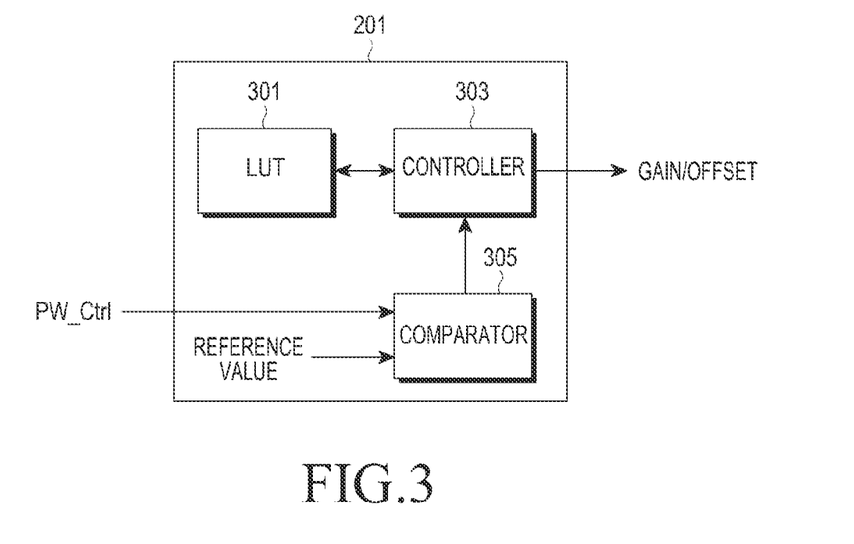
FIG. 3 is a block diagram illustrating a gain/offset controller, according to an embodiment of the present disclosure.

FIG. 3 is a block diagram illustrating the gain/offset controller, according to an embodiment of the present disclosure.

Referring to FIG. 3, the gain/offset controller 201 includes a look-up table (LUT) 301, a controller 303, and a comparator 305.

The LUT 301 includes shape tables having a number of curve values. The values of the LUT 301 may be determined by a simulation, stored in the fixed form in the hardware design stage, or stored by receiving them from the modem in an initial setting stage. The comparator 305 compares the power control signal PW_Ctrl input from the modem with a predetermined reference value, and sends the comparison result to the controller 303. The controller 303 separates and converts data values stored in the LUT 301 into gains and offsets based on the comparison result received from the comparator 305. The controller 303 outputs the results to the power controller 202 and AC coupling/DC feedback controller 206.

A shape table for forming a single curve has traditionally been used, and thus, the gain and the offset have been fixed, resulting in the use of a restricted back-off section. In accordance with an embodiment of the present disclosure, however, with shape tables including a number of curves, different gains and offsets may be set for a plurality of sections divided by power level, thereby improving the back-off efficiency of the RF PA operating in the ET mode. In an embodiment of the present disclosure, curves of supply power of the linear regulator may first be determined by experiments for respective output power regions in the ET mode. As the output power regions become finer, the shape is made more optimal, in which case, however, the number of tables to be stored in the LUT 301 increases and the processing time may become longer. Therefore, the appropriate number of output power regions should be made by taking into account a tradeoff between complexity and efficiency of the system. Once respective gains and offsets are determined by experiments for the plurality of output power regions, shape tables with the determined gains and offsets may be stored in the LUT 301. The number of columns of the LUT 301 is the same as the number of output power regions. The controller 303 extracts, from the LUT 301, values (a gain and an offset) in a column matched with a power region corresponding to the comparison result of the comparator 305.

In the ET mode, the output voltage of the buck booster 203 may be used as a fixed supply voltage of the linear regulator 204. The maximum output voltage of the buck booster 203 may be determined by a peak output voltage of the SM 200 while the minimum output voltage is determined by a minimum operating voltage of the linear regulator 204. Accordingly, in a range from the back-off power lower than a certain value to the power for conversion from ET mode to APT mode, maintaining the fixed supply voltage of the buck booster 203 may increase power efficiency. After conversion into the APT mode, the fixed supply voltage of the buck booster 203 must be linearly controlled.

Figure 4:
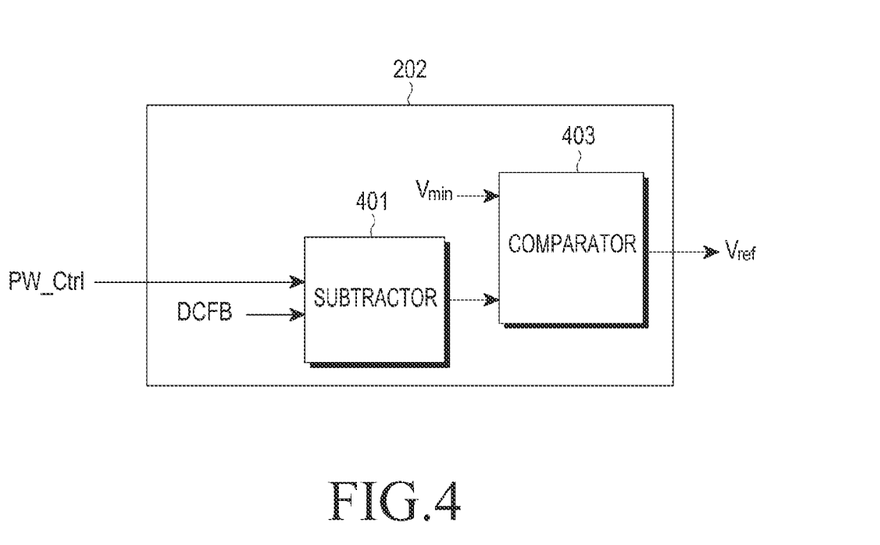
FIG. 4 is a block diagram illustrating a power controller, according to an embodiment of the present disclosure.

FIG. 4 is a block diagram illustrating the power controller, according to an embodiment of the present disclosure.

Referring to FIG. 4, the power controller 202 includes a subtractor 401 and a comparator 403.

The subtractor 401 outputs a value obtained by subtracting a predetermined DC feedback (DCFB) value from the power control signal PW_Ctrl sent from the modem. The comparator 403 outputs a supply voltage Vref of the buck booster 203 by comparing the value from the subtractor 401 with a minimum voltage value (Vmin) for conversion from the APT mode to the ET mode. The minimum value Vmin is determined in advance. The subtractor 401 and the comparator 403 are activated in the ET mode but deactivated in the APT mode.

Figure 5:
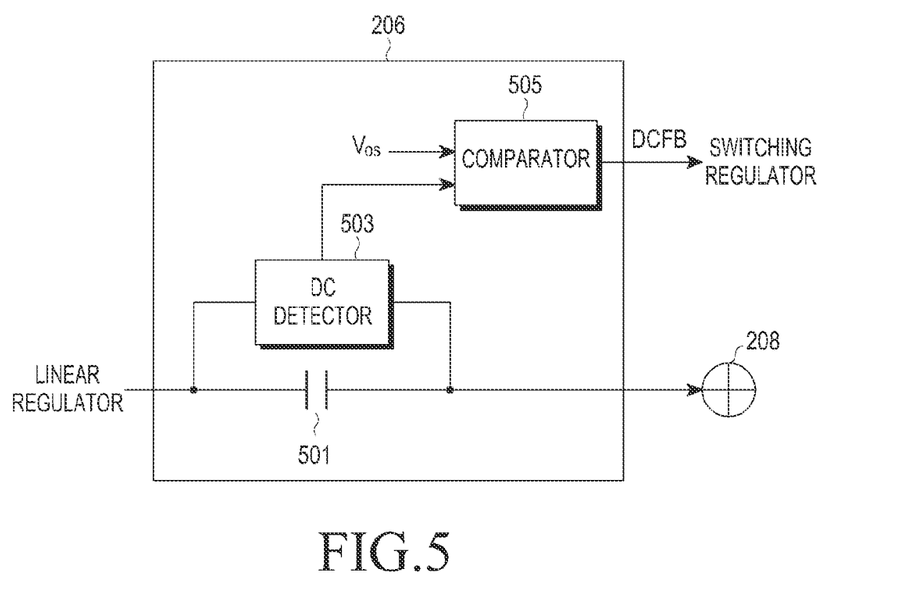
FIG. 5 is a block diagram illustrating an alternate current (AC) coupling/direct current (DC) feedback controller, according to an embodiment of the present disclosure.

FIG. 5 is a block diagram illustrating the AC coupling/DC feedback controller, according to an embodiment of the present disclosure.

Referring to FIG. 5, the AC coupling/DC capacitor 206 includes an AC coupling capacitor 501, a DC detector 503, and a comparator 505.

The AC coupling capacitor 501 only outputs an AC-coupled signal from a signal sent from the linear regulator 204. The DC detector 503 detects a DC voltage across the AC coupling capacitor 501. The comparator 505 sends a DC feedback (DCFB) value to the switching regulator 205 by comparing a reference value Vos input from the gain/offset controller 201 and a voltage detected by the DC detector 503.

Figure 6:
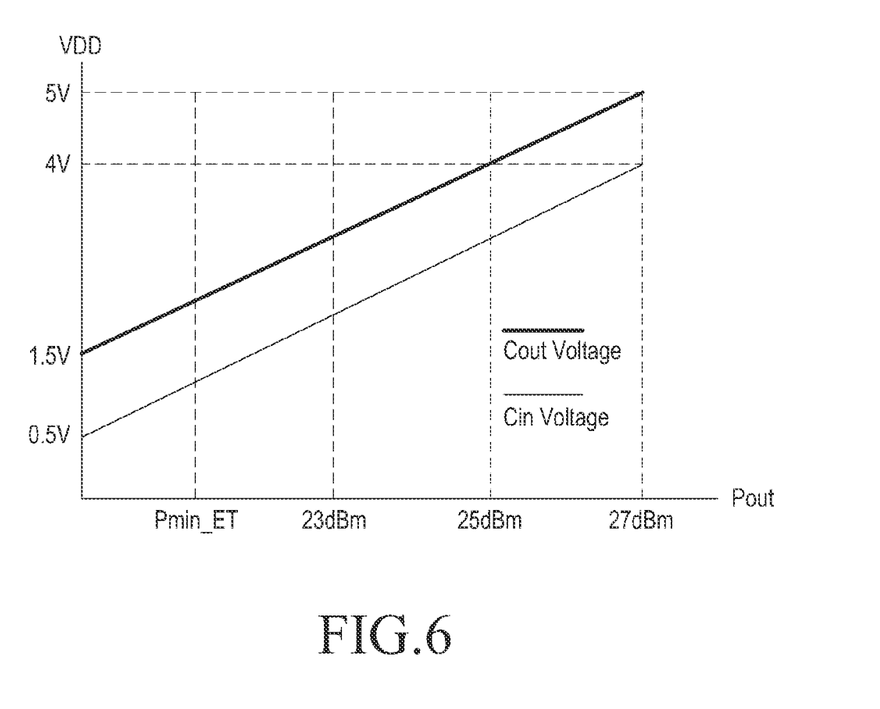
FIG. 6 is a graph illustrating a variation of SM output voltage according to DC offset values of an AC coupling capacitor, according to an embodiment of the present disclosure.

FIG. 6 is a graph illustrating variation of SM output voltage according to DC offset values of the AC coupling capacitor, according to an embodiment of the present invention.

As shown in FIG. 6, assuming that a DC offset value across the AC coupling capacitor is 1V and the output voltage of the linear regulator is 1.5~5.0V without use of the AC coupling capacitor, the output voltage of the linear regulator may be reduced to 0.5~4.0V with use of the AC coupling capacitor, in accordance with embodiments of the present disclosure.

Figure 7:
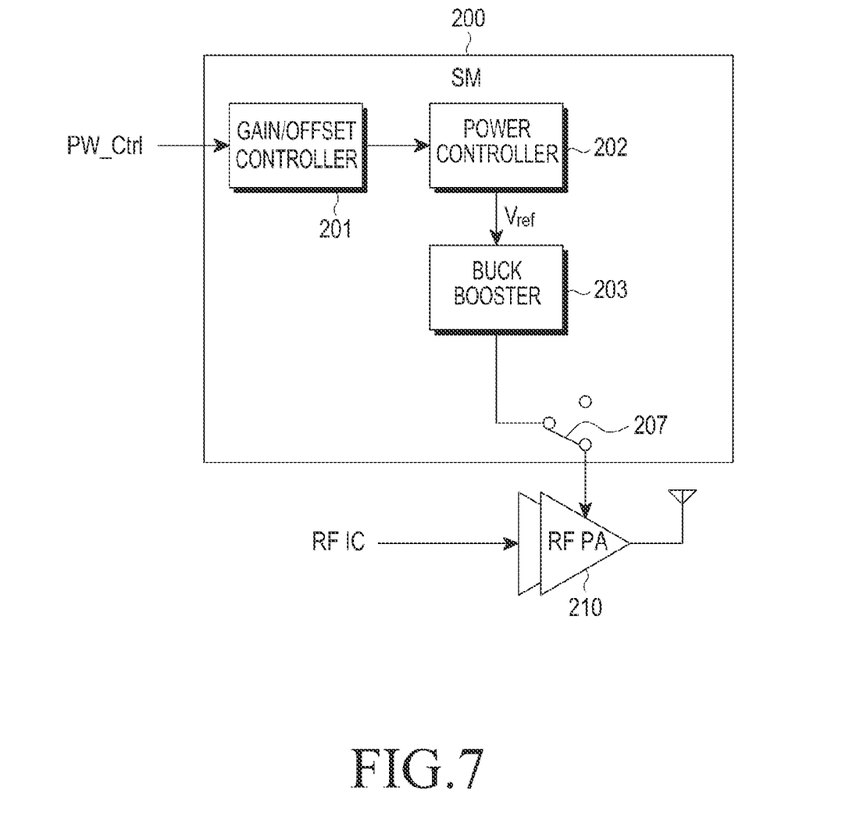
FIGS. 7 and 8 are diagrams illustrating operation of an SM in different modes, according to an embodiment of the present disclosure.
Figure 8:
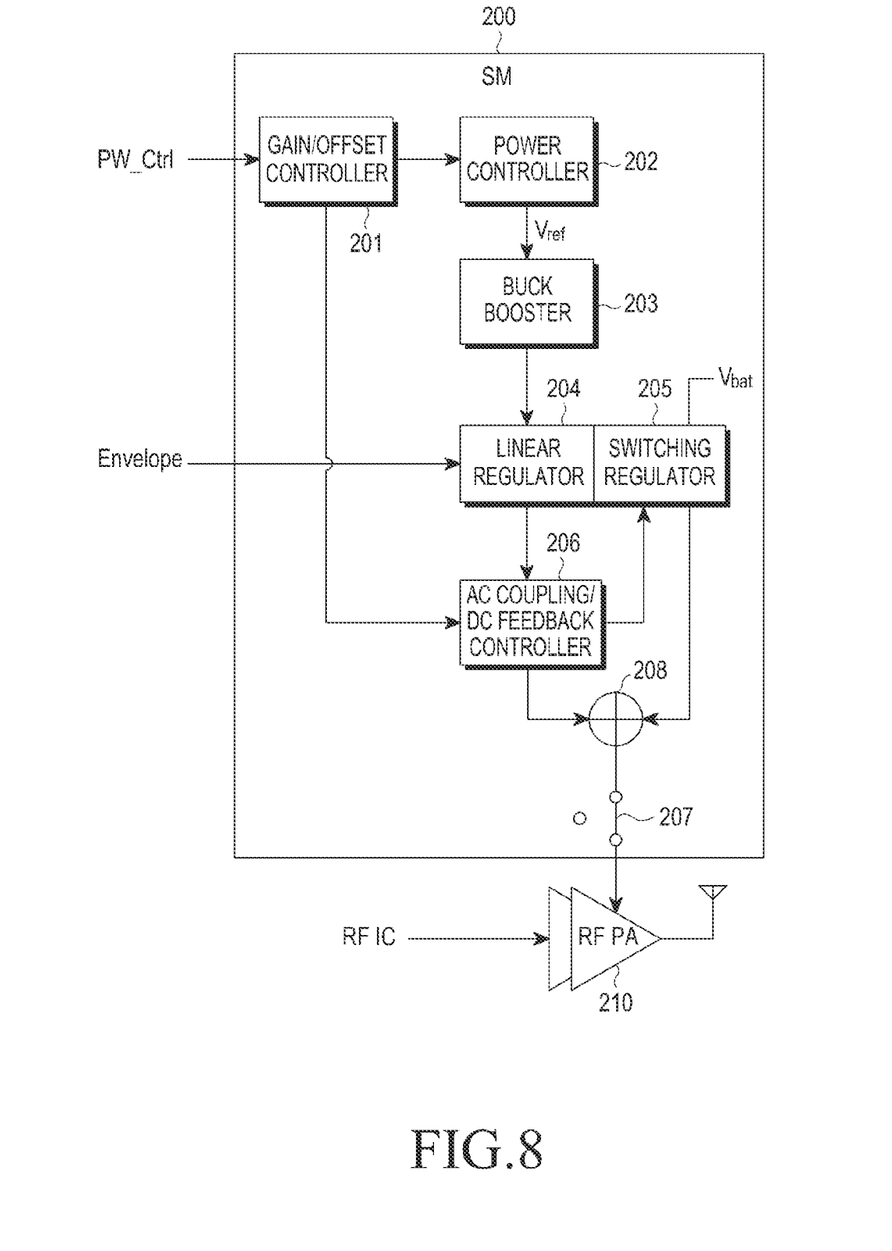

FIGS. 7 and 8 are diagrams illustrating operation of the SM in different modes, according to an embodiment of the present disclosure. Specifically, FIG. 7 is a diagram illustrating operation of the SM in the APT mode, and FIG. 8 is a diagram illustrating operation of the SM in the ET mode.

Referring to FIG. 7, once the power controller 202 operates the RF PA 210 in the APT mode based on the level of the power control signal PW_Ctrl input from the modem, the reference voltage Vref input to the buck booster 203 is controlled by the power controller 202 to suit the APT mode, and thus, the output voltage of the buck booster 203 may be controlled.

In addition, while the RF PA 210 is operating in the APT mode, the switch 207 is connected to the buck booster 203 and the buck booster is disconnected from the linear regulator 204. Accordingly, the SM 200 has the arrangement of FIG. 7, and the RF PA 210 operates according to the output voltage of the buck booster 203.

Referring to FIG. 8, once the power controller 202 operates the RF PA 210 in the ET mode based on the level of the power control signal PW_Ctrl input from the modem, the reference voltage Vref input to the buck booster 203 is controlled by the power controller 202 to suit the ET mode, and thus, the output voltage of the buck booster 203 may be controlled.

In addition, while the RF PA 210 is operating in the ET mode, the switch 207 is disconnected from the buck booster 203 and connected to the combiner 208. Accordingly, the SM 200 has the arrangement as in FIG. 8, and the RF PA 210 operates according to the voltage input from the combiner 208.

Furthermore, in the ET mode, the gain/offset controller 201 adaptively controls a gain and an offset of an output voltage of the SM 200 based on output power of the RF PA 210 operating in the ET mode, by receiving the power control signal PW_Ctrl from the modem and sending a reference signal to the AC coupling/DC feedback controller 206.

Figure 9:
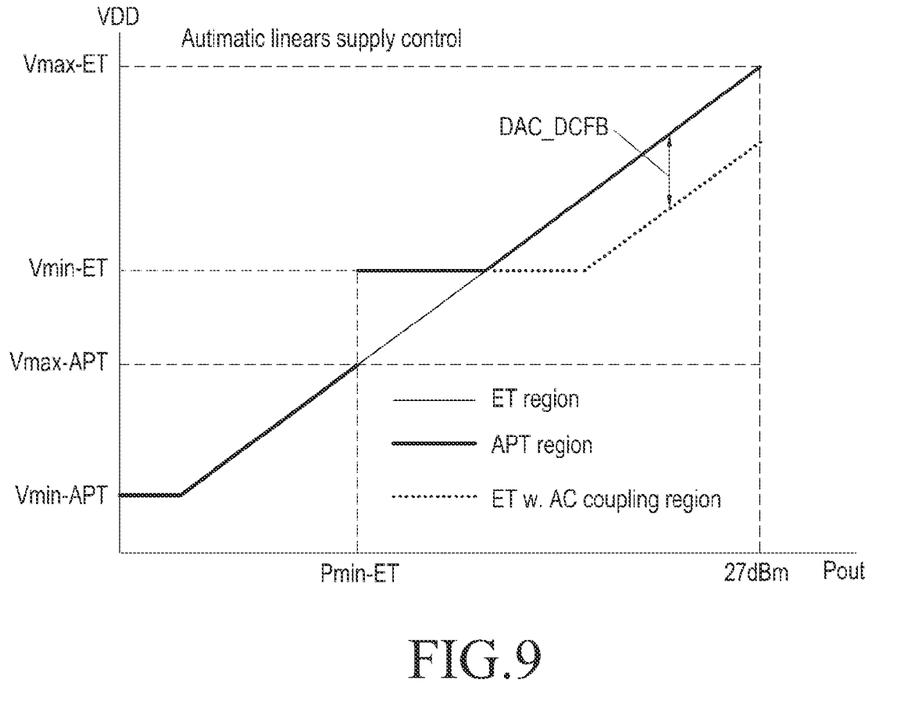
FIG. 9 is a graph illustrating voltage control by a power controller, according to an embodiment of the present disclosure.

FIG. 9 is a graph illustrating voltage control by a power controller, according to an embodiment of the present disclosure.

In FIG. 9, Pmin_ET indicates a minimum output power of the buck booster that may operate in the ET mode, and Vmax_APT indicates a maximum fixed supply voltage for operation in the APT mode. Vmin_APT indicates a minimum voltage for operation of the buck booster.

In the ET mode, since the output voltage of the buck booster is used as a fixed supply voltage for the linear regulator, the maximum output voltage of the buck booster is determined by an SM peak output voltage, and the minimum output voltage of the buck booster is determined by the minimum operating fixed supply voltage Vmin (Vmin_ET in FIG. 8) of the linear regulator. As such, the power controller in accordance with an embodiment of the present disclosure, adaptively controls the output voltage of the buck booster in respective back-off power regions in the ET mode. The power controller also maintains the output voltage of the buck booster at the minimum voltage Vmin_ET for operating the linear regulator, from the back-off power less than a certain value to the power Pmin_ET for ET/APT mode conversion. The maximum voltage Vmax_APT at which the APT mode is converted to the EP mode is experimentally determined. In the APT mode, the power controller linearly controls the voltage of the buck booster based on the PW_Ctrl signal input from the modem.

Output power of the communication system depends on channel conditions. The modem may generate the power control signal PW_Ctrl to suit the output power, and the power control signal PW_Ctrl may be input to the SM and PA. The SM may determine a mode by comparing the PW_Ctrl input from the modem, and Vmax_APT. If the PW_Ctrl value decreases and leaves a region for operating in the ET mode, the SM may be changed into the APT mode. The entire efficiency of the SM may be determined by the ratio between the input voltage and the output voltage, and the supply voltage for the linear regulator, having a large part of the SM, is included in the linear section of FIG. 9 in the ET mode, which secures high SM efficiency. However, in the section operating in the ET mode where the supply voltage of the linear regulator converges, such as Vmin_ET, the SM efficiency decreases. Accordingly, the minimum voltage value Vmin to secure the linear section of the ET mode to the maximum extent may be experimentally determined.

Moreover, in accordance with the embodiment of the present disclosure, the entire SM efficiency may be improved with the use of the AC coupling capacitor. For example, if the range of output voltage of the conventional SM without use of the AC coupling capacitor is 1.5V~5.0V, the fixed supply voltage of the linear regulator must have the peak voltage of 5.0V in consideration of a headroom voltage of a transistor. However, since power consumption increases with the fixed supply voltage, thereby decreasing the SM efficiency, lowering the supply voltage may reduce the power consumption. In an embodiment of the present disclosure, the output voltage level of the linear regulator may be lowered by a DC offset value (DAC_DCFB of FIG. 8) relative to an SM output by means of the AC coupling capacitor. As such, with the use of the AC coupling capacitor, the peak voltage level of an output signal of the linear regulator may be lowered by a DC offset value, thereby increasing entire SM efficiency. The DC offset value may be experimentally determined regarding an envelope shaping function of the SM. Since the importance of small level signals depends on the average level of the envelope signal, DC offset values or DC offset levels need to be set differently, by means of the AC coupling capacitor. For example, since large signals are generally received in a TTI section where the average signal level is high, the importance of relatively small level signals is low. Accordingly, the ET PA efficiency of the entire signal may not be affected even if the small level signals are ignored to a certain extent, and the DC offset may be set to a relatively large value. On the contrary, when the average signal level is low, the importance of small level signals is very high, so a desired ET efficiency may be secured only if there is no loss of small level signals, and the DC offset may be set to a relatively small value.

Figure 10:
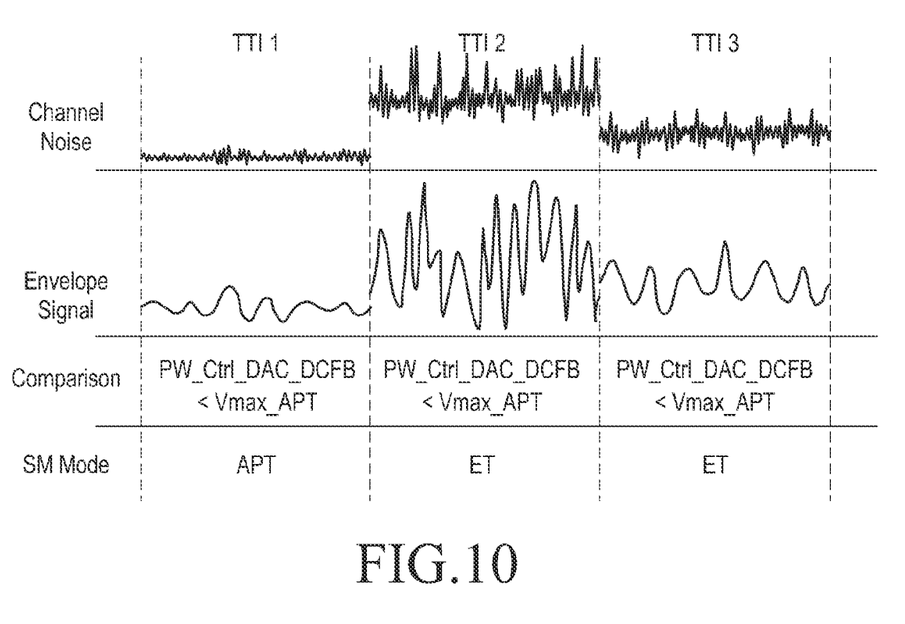
FIG. 10 is a diagram illustrating SM mode changes depending on channel conditions in a communication system when an SM is applied, according to an embodiment of the present disclosure.

FIG. 10 is a diagram illustrating SM mode changes depending on channel conditions in a communication system when an SM is applied, according to an embodiment of the present disclosure.

The modem may change PW_Ctrl to suit a channel condition in every TTI section. In TTI 1 where the channel condition is good, a low fixed supply voltage is available, so the level of an envelope signal is low. In this case, the SM controls the power of the buck booster in the APT mode. In TTI 2 where the channel condition becomes worse, a high output power is required, and thus, the level of the envelope signal increases. In this case, the SM operates in the ET mode, comparing (PW_Ctrl−DAC_DCFB) and a Vmin value and outputting a bigger one as supply power for the buck booster. In FIG. 10, since (PW_Ctrl−DAC_DCFB) is greater than the Vmax_APT in the TTI 2, (PW_Ctrl−DAC_DCFB) is output as the supply power for the buck booster. Finally, in TTI3, (PW_Ctrl−DAC_DCFB) is less than Vmax_APT, and Vmax_APT is output as the supply power for the buck booster.

Figure 11A:
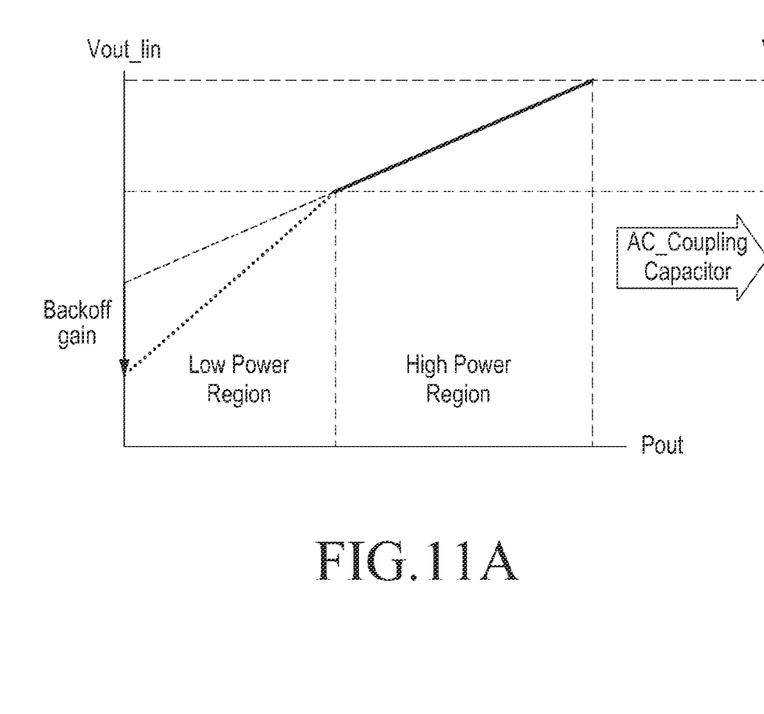
FIGS. 11A and 11B are diagrams illustrating a fixed supply voltage of a linear regulator of an SM and output voltage of the SM, according to an embodiment of the present disclosure.
Figure 11B:
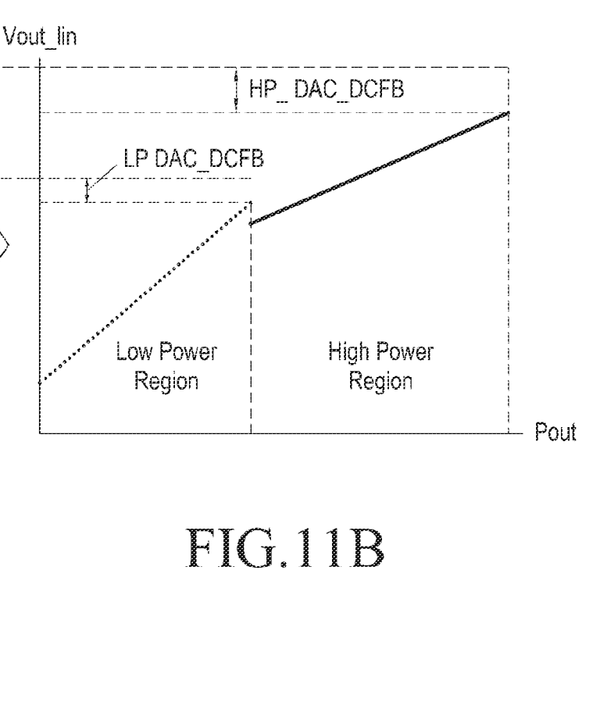

FIGS. 11A and 11B are diagrams illustrating a fixed supply voltage of the linear regulator of the SM and output voltage of the SM, according to an embodiment of the present disclosure.

FIG. 11A is a diagram illustrating output voltage of the SM using the gain/offset controller, according to an embodiment of the present disclosure. The gain/offset controller sets gains and offsets differently for a high power region and a low power region by using pre-stored shape tables. The use of different gains and offsets for different power regions enables a low output voltage to be used in a low power region, thereby improving the back-off efficiency. Accordingly, the entire system efficiency may be improved.

While setting different gains and offsets for different power regions, DC offset values (DAC_DCFB) may be set differently for the power regions by means of the AC coupling capacitor, according to changes in input signal characteristics, as described in detail above. This enables improvement in both the SM efficiency and the ET PA efficiency. FIG. 11B is a diagram illustrating application of not only gains and offsets but also DC offset values with the use of the AC coupling capacitor for power regions, according to an embodiment of the present disclosure. Compared with FIG. 11A where no AC coupling capacitor is used, the use of the AC coupling capacitor may lower the output voltage by the DC offset value DAC_DCFB, where the DC offset value being different in every power region.

While the power regions are classified into two regions in FIGS. 11A and 11B, they may also be divided into more regions. Although finer classification of the power region may increase the SM efficiency, it may also increase complexity in controlling the SM. Thus, the modem may appropriately select the degree of classification of the power region by taking into account the circuit complexity.

Figure 12:
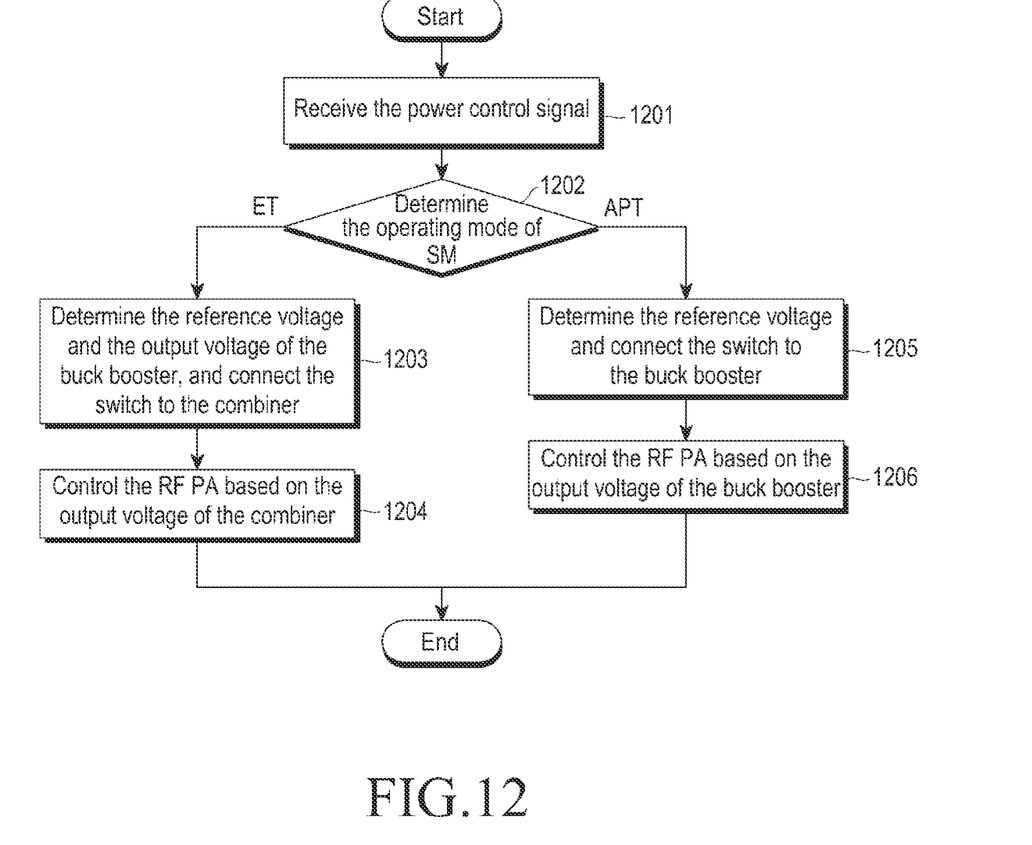
FIG. 12 is a flowchart illustrating operation of the SM, according to an embodiment of the present disclosure.

FIG. 12 is a flowchart illustrating operation of the SM according to an embodiment of the present disclosure.

Referring to FIG. 12, the SM receives the power control signal PW_Ctrl input from the modem in step 1201 and determines the operating mode based on the level of the power control signal PW_Ctrl in step 1202. When the operating mode of the SM is determined the ET mode, the reference voltage Vref input to the buck booster 203 is controlled by the power controller 202 to suit the ET mode, and thus, the output voltage of the buck booster 203 may be controlled in step 1203. In addition, the switch 207 is connected to the combiner 208 in step 1203. Accordingly, the RF PA 210 operates according to the voltage input from the combiner 208 in step 1204.

Otherwise, when the operating mode of the SM is determined the APT mode, the reference voltage Vref input to the buck booster 203 is controlled by the power controller 202 to suit the APT mode, and thus, the output voltage of the buck booster 203 may be controlled in step 1205. In addition, in step 1205, the switch 207 is connected to the buck booster 203. Accordingly, the RF PA 210 operates according to the output voltage of the buck booster 203 in step 1206.

As described above, in accordance with an embodiments of the present disclosure, entire SM efficiency may be improved by classifying output power into a plurality of power regions and adaptively controlling the fixed supply voltage of the linear regulator in each power region. Moreover, power efficiency in the ET mode may also be increased by controlling input signal characteristics and corresponding DC offset voltage across the AC coupling capacitor. Using different gains and offsets for different power regions may enable the use of low output voltage in a low power region for operating in the APT mode, thereby improving the back-off efficiency. In addition, in accordance with the embodiments of the present disclosure, complexity of an RF circuit of a communication terminal may decrease by performing power control with a hardware circuit comprised of a digital controller and a DAC.

Particular aspects of the present disclosure may be implemented as computer-readable codes embodied on a computer-readable recording medium from a particular perspective. The computer-readable recording medium is any data storage device that may store data readable to computer systems. Examples of the computer-readable recording medium may include read only memories (ROMs), random access memories (RAMs), compact disk-read only memories (CD-ROMs), magnetic tapes, floppy disks, optical data storage devices, or carrier waves (e.g., data transmission via the Internet), etc. The computer-readable recording medium may be distributed by computer systems connected over a network, and thus, the computer-readable codes may be stored and executed in distributed ways. Furthermore, functional programs, codes, and code segments for achieving various embodiments of the present disclosure may be readily interpreted by skilled programmers in the art to which embodiments of the present disclosure are applied.

It will be appreciated that the embodiments of the present disclosure may be implemented in a form of hardware, software, or a combination of hardware and software. The software may be stored as program instructions or computer readable codes executable on the processor on a computer-readable medium, as described above. This media can be read by the computer, stored in the memory, and executed by the processor. The method in accordance with an embodiment of the present disclosure may be implemented by a computer or portable terminal including a controller and a memory, and the memory may be an example of the computer readable recording medium suitable for storing a program or programs having instructions that implement the embodiments of the present disclosure.

The present disclosure may be implemented by a program having codes for embodying the apparatus and method described in claims, the program being stored in a machine (or computer) readable storage medium. The program may be electronically carried on any medium, such as communication signals transferred via wired or wireless connection, and the present disclosure suitably includes its equivalent.

The electronic device in accordance with the embodiments of the present disclosure may receive and store the program from a program provider connected thereto via cable or wirelessly. The program provider may include a memory for storing programs having instructions to perform the embodiments of the present disclosure, information necessary for the embodiments of the present disclosure, etc., a communication unit for wired/wirelessly communicating with mobile devices, and a controller for sending the program to the mobile devices on request or automatically.

In accordance with embodiments of the present disclosure, efficiency of an SM, which is a key part of an ET power amplifier, may be improved in respective peak power and back-off power regions. Moreover, respective peak power and back-off power efficiencies of the ET power amplifier may be improved by implementing an optimized interface of an RF power amplifier and the SM. In addition, the improved back-off power efficiency leads to reduced battery consumption of a communication terminal, and thus, to increased operating hours of the terminal, and the improved peak power efficiency of the power amplifier leads to reduction in heat generation of the terminal.

While certain embodiments have been shown a described, it will be understood by those skilled in the art that various changes in form and detail may be made therein without departing from the spirit and scope of the invention as defined by the appended claims.

What is claimed is:

1. A supply modulator (SM) for supplying power from a wireless transmitter to a radio frequency (RF) power amplifier, the SM comprising:
   a power controller configured to receive a power control signal input from a modem and output a reference voltage, wherein the power controller changes an operating mode of the SM by controlling a level of the reference voltage;
   a buck booster configured to receive the reference voltage from the power controller and output a voltage-based on the level of the reference voltage;
   a combiner configured to combine a first output signal from a linear regulator and a second output signal from a switching regulator to obtain a combined result, and to output the combined result, wherein the first output signal is based on the voltage outputted from the buck booster; and a switch having a first end connected to a power supply end of the RF power amplifier and a second end that is switchable between the buck booster and the combiner, and configured to change the operating mode of the SM to an envelope tracking (ET) mode or an average power tracking (APT) mode based on whether the second end is connected to the buck booster or the combiner.

2. The SM of claim 1, wherein the linear regulator is configured to receive the voltage from the buck booster, amplify an envelope signal received from the modem, and output the amplified envelope signal.

3. The SM of claim 2, further comprising an alternate current (AC) coupling unit configured to receive the amplified envelope signal from the linear regulator, perform AC coupling on the amplified envelope signal to generate an AC-coupled signal, and to output the AC-coupled signal to the combiner.

4. The SM of claim 3, wherein the AC coupling unit further comprises:
an AC coupling capacitor;
a voltage detector configured to detect a direct current (DC) voltage across the AC coupling capacitor; and
a third comparator configured to output a DC feedback value to the switching regulator based on a comparison result of comparing the DC voltage and a reference value input from a gain and offset controller,
wherein the second output signal of the switching regulator is an output voltage based on the DC feedback value.

5. The SM of claim 1, further comprising:
a gain and offset controller configured to compare the power control signal input from the modem and a predetermined reference value, and output a value of a gain and a value of an offset based on the comparison to the power controller, while the SM is operating in the ET mode.

6. The SM of claim 5, wherein the gain and offset controller comprises:
a lookup table that includes a shape table having at least two curve values;
a first comparator configured to compare the power control signal input from the modem and the predetermined reference value; and
a controller configured to separate and convert data values in the shape table into values of gains and values of offsets, based on the comparison result from the first comparator.

7. The SM of claim 6, wherein the shape table includes respective values of gains and values of offsets for at least two output power sections divided by output power level of the SM.

8. The SM of claim 5, further comprising:
a second converter configured to convert a reference value output from the gain and offset controller to an analog signal and forward the analog signal to an AC coupling unit.

9. The SM of claim 1, wherein the power controller comprises:
a subtractor configured to output a value obtained by subtracting a predetermined value from the power control signal input from the modem; and
a second comparator configured to compare the value output from the subtractor with a minimum voltage value for conversion of the operating mode of the SM, wherein the level of the reference voltage input to the buck booster is controlled based on the comparison result of the second comparator.

10. The SM of claim 9, wherein the second comparator is configured to:
output an output value of the subtractor as the reference voltage if the output value of the subtractor is greater than the minimum voltage value, and
output the minimum voltage value as the reference voltage if the output value of the subtractor is less than or equal to the minimum voltage value.

11. The SM of claim 1, further comprising:
a first converter configured to convert the reference voltage output from the power controller to an analog signal and forward the analog signal to the buck booster.

12. A method for supplying power from a wireless transmitter to a radio frequency (RF) power amplifier by a supply modulator (SM), the method comprising:
receiving a power control signal input from a modem;
determining a reference voltage based on the power control signal, wherein an operating mode of the SM is changed by controlling a level of the reference voltage;
determining a voltage based on the level of a reference voltage;
when the operating mode of the SM is an envelope tracking (ET) mode, combining a first output signal from a linear regulator and a second output signal from a switching regulator to obtain a combined result, and outputting the combined result, wherein the first output signal is based on the voltage; and
when the operating mode of the SM is an average power tracking (APT) mode, outputting the voltage.

13. The method of claim 12, wherein, when the operating mode of the SM is the ET mode, further comprising:
amplifying an envelope signal received from the modem; and
performing AC coupling on the amplified envelope signal to generate an AC-coupled signal; and
outputting the AC-coupled signal as the first output signal.

14. The method of claim 13, wherein, when the operating mode of the SM is the ET mode, further comprising:
detecting a direct current (DC) voltage across a AC coupling capacitor; and
comparing the DC voltage and a reference value input from a gain and offset controller to obtain a DC feedback value,
wherein the second output signal of the switching regulator is an output voltage based on the DC feedback value.

15. The method of claim 12, wherein, prior to determining the reference voltage, further comprising:
comparing the power control signal input from the modem and a predetermined reference value; and
outputting a value of a gain and a value of an offset based on the comparison, while the SM is operating in the ET mode.

16. The method of claim 15, wherein comparing the power control signal input from the modem and the predetermined reference value comprises:
separating and converting data values in a shape table having at least two curve values into values of gains and values of offsets, based on the comparison result.

17. The method of claim 16, wherein the shape table includes respective values of gains and values of offsets for at least two output power sections divided by output power level of the SM.

18. The method of claim 16, wherein, determining the reference voltage comprises:

subtracting a predetermined value from the power control signal input from the modem to obtain a subtracted value; and comparing the subtracted value with a minimum voltage value for conversion of the operating mode of the SM, wherein the level of the reference voltage is controlled based on the comparison result.

19. The method of claim 18, further comprising:

outputting the subtracted value as the reference voltage if the subtracted value is greater than the minimum voltage value; and outputting the minimum voltage value as the reference voltage if the subtracted value is less than or equal to the minimum voltage value.

20. An article of manufacture for supplying power from a wireless transmitter to a radio frequency (RF) power amplifier by a supply modulator (SM), comprising a non-transitory machine readable medium containing one or more programs which when executed implement the steps of:

receiving a power control signal input from a modem determining a reference voltage based on the power control signal, wherein an operating mode of the SM is changed by controlling a level of the reference voltage;

determining a voltage based on the level of the reference voltage;

when the operating mode of the SM is an envelope tracking (ET) mode, combining a first output signal from a linear regulator and a second output signal from a switching regulator to obtain a combined result, and outputting the combined result, wherein the first output signal is based on the voltage; and when the operating mode of the SM is an average power tracking (APT) mode, outputting the voltage based on the reference voltage.

* * * * *